United States Patent [19]
Hoff

[11] Patent Number: 4,768,170
[45] Date of Patent: Aug. 30, 1988

[54] MOS TEMPERATURE SENSING CIRCUIT
[75] Inventor: David L. Hoff, Fair Oaks, Calif.
[73] Assignee: Intel Corporation, Santa Clara, Calif.
[21] Appl. No.: 871,330
[22] Filed: Jun. 6, 1986
[51] Int. Cl.⁴ .............................................. G11C 7/04
[52] U.S. Cl. .................................. 365/212; 365/189; 365/207; 307/310
[58] Field of Search ........................ 365/207, 210–213, 365/226–229, 189; 307/310, 591

[56] References Cited
U.S. PATENT DOCUMENTS

| | | | |
|---|---|---|---|
| 3,705,392 | 12/1972 | Appelt | 365/227 |
| 3,835,458 | 9/1974 | Mrazek | 365/211 |
| 4,215,282 | 7/1980 | Brown et al. | 307/310 |

Primary Examiner—James W. Moffitt
Attorney, Agent, or Firm—Blakely, Sokoloff, Taylor & Zafman

[57] ABSTRACT

An MOS temperature sensing circuit formed on a silicon substrate which may be used for disabling portions of output drivers in EPROM at high temperatures. The circuit uses a first and second diode, one of which has substantially larger area than the other. The diodes are reverse biased through field-effect transistors. The leakage from the smaller diode is used to cancel the effects process variations on the leakage current of the larger diode, thereby providing a circuit with an output substantially dependent only on temperature.

16 Claims, 3 Drawing Sheets

MOS TEMPERATURE SENSING CIRCUIT

BACKGROUND OF THE INVENTION

1. Field of the Invention

The invention relates to the field of MOS temperature sensing circuits.

2. Prior Art

It is well-known that metal-oxide-semiconductor (MOS) circuit characteristics widely vary with normal process variations. Moreover, circuit characteristics change considerably with temperature. For this reason, for instance, it is difficult to generate a stable reference potential with an MOS circuit.

Leakage current is one parameter which varies greatly with both process variation and temperature. This current affects the performance of MOS circuits, and by way of example, determines the refresh time in a dynamic access memory. In general, leakage current is considered to be an undesirable chracteristic particularly because of its temperature variations.

The present invention uses the variations of leakage current with temperature to provide a temperature sensing circuit as will be seen. Importantly, the present invention incorporates a second leakage device to cancel the effects of process variations on the leakage current of a first leakage device, thereby providing a circuit with an output substantially dependent only on temperature.

SUMMARY OF THE PRESENT INVENTION

In the currently preferred embodiment a temperature sensing circuit is realized using a first and second field-effect transistor coupled to a first and second diode, respectively. The first diode has substantially greater substrate area and periphery than the second diode. In fact, the second diode can be simply the source-to-substrate terminal of the second field-effect transistor.

The first and second diodes are coupled to a differential amplifier, the output of which can provide a binary signal which changes state at a predetermined temperature.

The second field effect transistor and second diode compensate for the effects of process variations, thus making the circuit stable with respect to process variations and substantially dependent on only temperature.

DETAILED DESCRIPTION OF THE PRESENT INVENTION

An MOS temperature sensing circuit is described. In the following description, numerous specific details are set forth such as specific device sizes in order to provide a thorough understanding of the present invention. It will be obvious to one skilled in the art, however, that the present invention may be practiced without these specific details. In other instance, well-known circuits and processes have not been in detail in order not to unnecessarily obscure the present invention.

The currently preferred embodiment of the present invention is realized using n-channel MOS transistors, in particular using both enhancement mode and depletion mode transistors. The enhancement mode transistors have a threshold voltage of approximately 1 volt, while the depletion mode transistors have a threshold voltage of approximately $-2.5$ volts. The circuit may be realized in other MOS technologies, such as complementary MOS technology. Well-known MOS or CMOS processes may be used to fabricate the present invention.

BLOCK DIAGRAM OF FIG. 1

Figure 1:
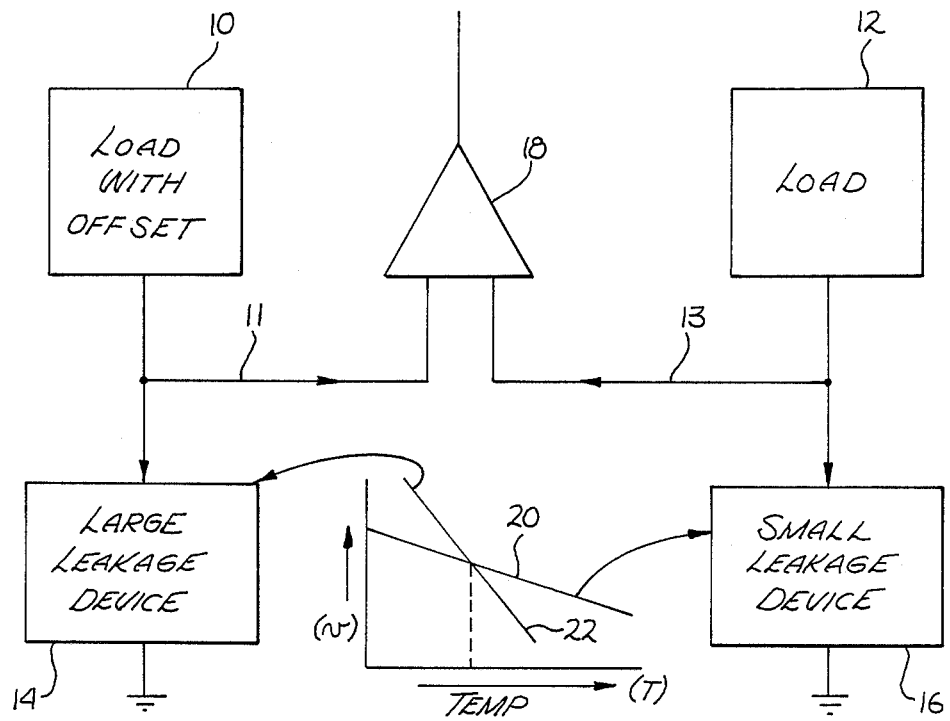
FIG. 1 is a block diagram illustrating the present invention.

The principle of the present invention is best seen from the diagram of FIG. 1. A first load device 10 which may be, for example, an ordinary field-effect transistor is coupled in series with a first leakage device 14, which may be a reverse biased diode. A second load device 12 is coupled in series with a second leakage device 16. Device 14 is substantially larger than device 16. The common node between load 10 and device 14 is coupled to one terminal of differential amplifier 18. Similarly, the common node 13 between load 12 and device 16 is coupled to the other input terminal of the differential amplifier 18.

At low temperatures, leakage current in MOS circuits is very low. Therefore, the potentials on nodes 11 and 13 are predominantly determined by the threshold voltages of the loads 10 and 12. In the preferred embodiment, an offset potential is used between the loads 10 and 12. That is, for example, the threshold voltage of load 12 is larger or the threshold voltage for load 12 is made lower. This results in node 11 being at a higher potential than node 13. The differential output registers this disparity as indicating low temperature.

At higher temperatures, the leakage current through devices 14 and 16 determines the potential on nodes 11 and 13, respectively. More leakage occurs through device 14 since it is larger than through device 16. The result is that node 11 is pulled closer to ground at higher temperature. The differential output then registers high temperature.

Leakage current, in general, varies exponentially as a function of temperature. When the characteristics of the load are considered, the output voltage acts more linear. The voltage versus temperature characteristics for load 10/device 14 and load 12/device 16 are shown in FIG. 1 as line 22 and line 20, respectively. The crossing point of these two lines is readily detectable by amplifier 18.

The leakage associated with devices 14 and 16 varies with several parameters other than temperature such as VCC and process variations including dopant concentrations, oxide thicknesses, etc. Ordinarily, using leakage current to detect temperature is not considered feasible because of these non-temperature related variations. However, with the present invention, these process variations are substantially eliminated. The leakage current of the smaller leakage device 16, in effect, subtracts out these anomalies through the differential amplifier 18. The result is that the temperature sensing circuit of FIG. 1 provides a stable and consistent means for determining temperature. The potential at the output of the amplifier 18 is substantially a function of temperature and remains relatively consistent from chip to chip.

PREFERRED EMBODIMENT OF FIG. 4

Figure 4:
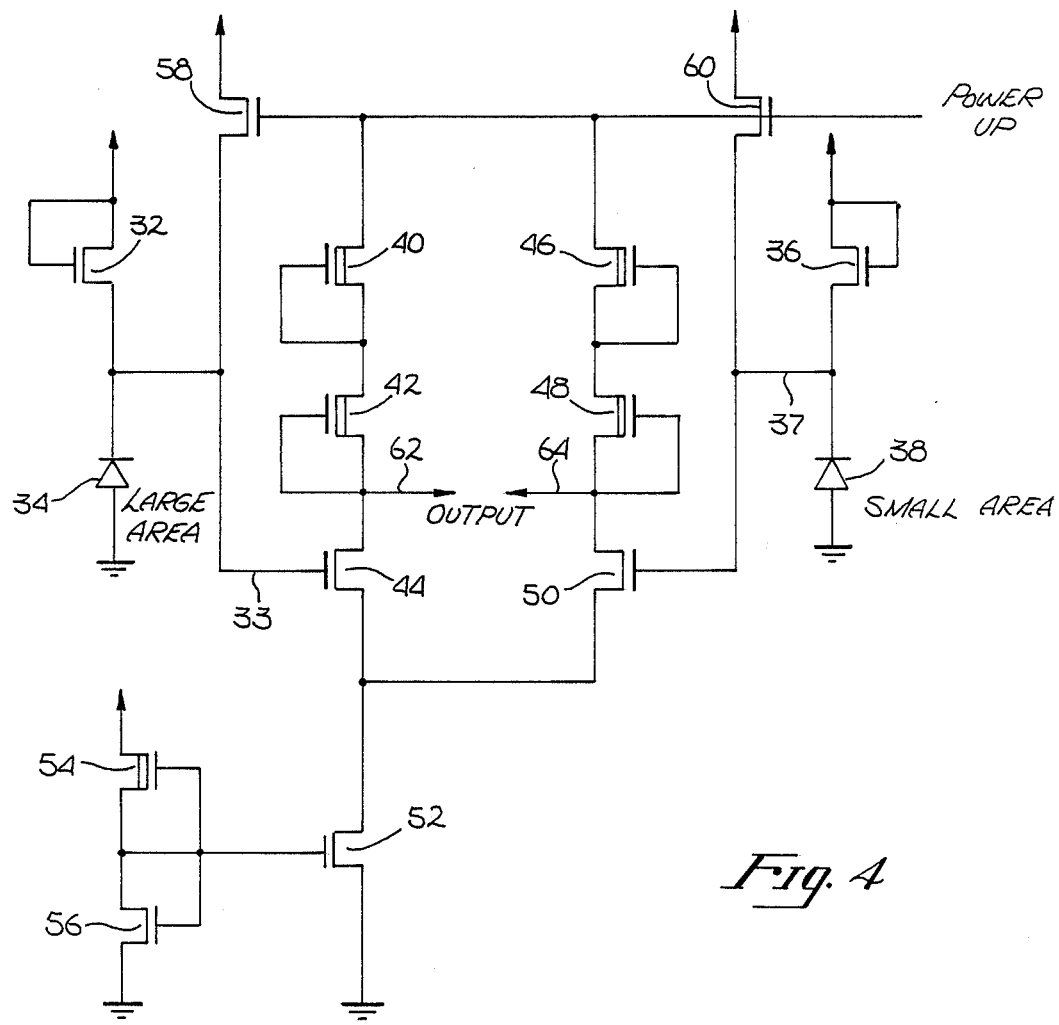
FIG. 4 is an electrical schematic of the presently preferred embodiment of the invention.

Referring to FIG. 4 in the preferred embodiment the first load comprises an enhancement mode transistor 32 with its gate and drain terminal coupled to the VCC potential. Its source terminal is coupled to diode 34 which is a relatively large diode. Diode 34 is reverse biased by the field-effect transistor 32. Similarly, the diode 38 which has a smaller area when compared to diode 34 is coupled to VCC through a load comprising the enhancement mode, field-effect transistor 36. The node 33 provides one input to a differential amplifier and specifically is coupled to the gate of transistor 44. Similarly, node 37 is coupled to the gate of transistor 50.

The differential amplifier of FIG. 4 comprises the depletion mode transistors 40 and 42 coupled in series with the enhancement mode transistor 44 in one branch, and the depletion mode transistors 46 and 48 coupled in series with the enhancement mode transistor 50 in its other branch. The source regions of transistors 44 and 50 are coupled to ground through transistor 52. This transistor is biased through the depletion mode transistor 54 and enhancement mode transistor 56. The output of the amplifier, nodes 62 and 64, may be coupled to other stages of the differential amplifier, to a Schmitt trigger or like binary device so that a binary output is obtained. Then, for instance, the binary output will change state at the current crossover point shown in FIG. 1.

Nodes 33 and 37 are coupled to VCC through transistors 58 and 60, respectively. On power-up of the circuit, the gates of these transistors are momentarily coupled to VCC to allow nodes 33 and 37 to be pulled up. If this is not done, transistors 32 and 36 will eventually pull up these nodes, however, this will require more time since the load devices are relatively small. Thus, the transistors 58 and 60 are used to more quickly stabilize the output of the circuit of FIG. 4. Offsets present in devices 58 and 60 alloy the circuit to power up in the desired state.

As previously mentioned, the threshold voltage for the n-channel enhancement mode transistors of FIG. 4 is approximately 1.0 volts and the threshold voltage for the n-channel depletion mode transistors of FIG. 4 is approximately −2.5 volts. The sizes of the transistors for the currently preferred embodiment are:

| TRANSISTOR NUMBER | CHANNEL WIDTH/LENGTH (in microns) |
|---|---|
| 58 | 200/7 |
| 60 | 200/12 |
| 40 | 7/7 |
| 42 | 7/7 |
| 46 | 7/7 |
| 48 | 7/7 |
| 44 | 100/6 |
| 50 | 100/6 |
| 52 | 40/4 |
| 56 | 40/4 |
| 54 | 7/10 |
| 32 | 7/200 |
| 36 | 5/200 |

Both transistors 32 and 36 are quite long to provide the high resistance needed to "amplify" the effects of the leakage. Note that transistors 32 has a wider channel and therefore a lower threshold voltage, thereby providing the offset potential discussed above.

Both the area and periphery of the area determine the leakage for the diodes 34 and 37. The geometry used for the large diode is discussed in conjunction with FIG. 5. The large diode has a masked area of approximately 10,000 microns$^2$ and a periphery of 5,000 microns for a temperature crossover point of approximately 75 degrees C. with the small diode having an area of 50 microns$^2$ and a periphery of 25 microns. The diodes are formed as doped junctions in the silicon substrate.

ALTERNATE LOAD AND LEAKAGE DEVICE CONFIGURATION

Figure 3:
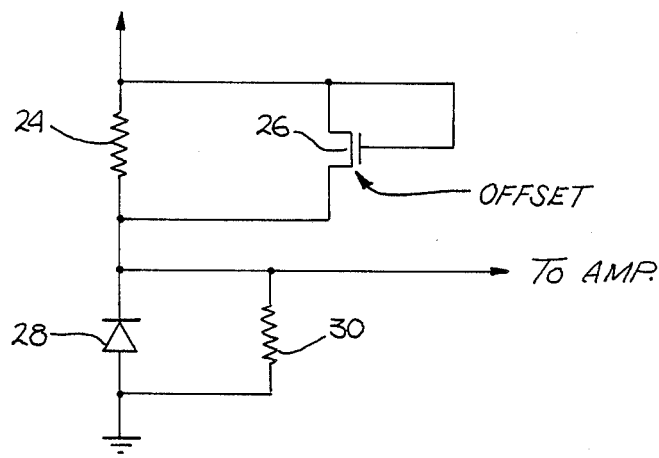
FIG. 3 illustrates an alternate embodiment of the load and leakage device illustrated in FIG. 1.

Referring to FIG. 3, the load 10 of FIG. 1 can be realized as a resistor 24 with an offset potential provided by a parallel field-effect transistor 26. Also, for this configuration an additional resistor 30 can be coupled in parallel with the leakage device, diode 28, to provide additional trip point control. In this case, the load 12 of FIG. 1 can also be a resistor such as resistor 24. The resistors may be formed using several well-known technologies, and for instance, can be fabricated from polycrystalline silicon.

LEAKAGE DEVICE FABRICATION

Figure 5:
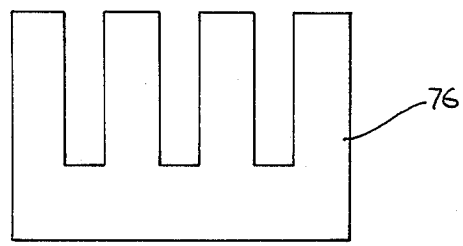
FIG. 5 is a plan view illustrating the diode layout for the larger diode used with the currently preferred embodiment of the present invention.

In the currently preferred embodiment, the leakage devices comprises an n-type region formed in a p-type substrate. The masked opening used to form this device for the larger diode is shown as masking member 76 to FIG. 5. The comb-like configuration of FIG. 5 is used to optimize the periphery of the doped region and hence, increase the leakage of the large diode while using a minimum of substrate area. (The leakage current is a function of both area and periphery.)

For the case of the small area diode, such as diode 38, a small area is all that is needed. Accordingly, in the preferred embodiment, the source region of a transistor is utilized. In fact, referring to FIG. 4, the source region of the transistor 36 comprises the diode 38. Contact is made to the source region and this contact is then coupled to the gate of the transistor 50.

A leakage device suitable for the present invention can also be realized by utilizing a grounded gate field-effect transistor. This type device has the advantage of requiring less substrate area and is easier to trim (trimming is described in conjunction with FIG. 6). Other MOS structures can be employed which have leakage which is a function of temperature, preferably where the leakage is an exponential function with respect to temperature.

TRIMMING

Where the circuit of the present invention is used to detect a predetermined temperature, it may be that the desired temperature (in absolute terms) is not obtained due to numerous variables even though the characteristics of the circuit are stable.

Figure 6:
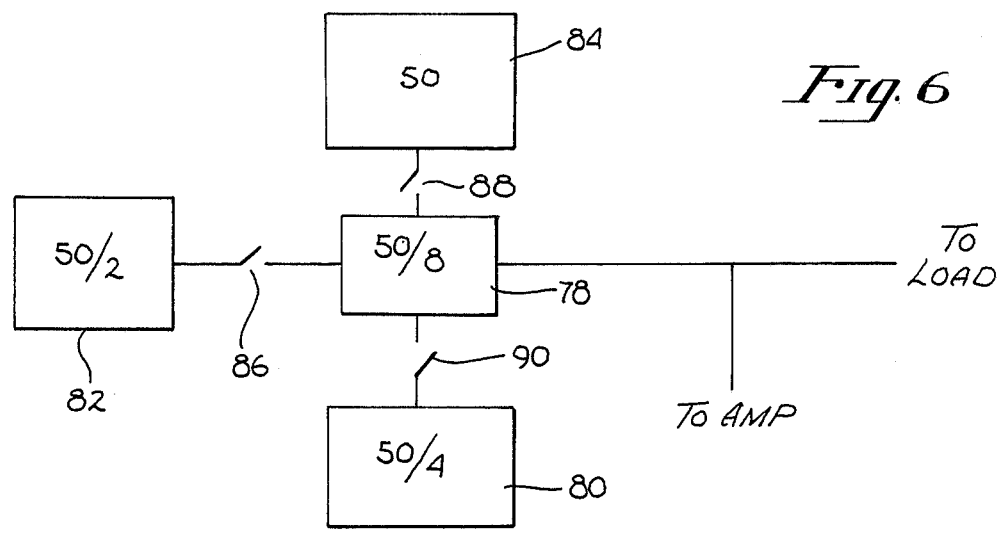
FIG. 6 is a diagram used to illustrate the trimming employed with the temperature sensing circuit of the present invention.

One trimming structure suitable for the present invention is shown in FIG. 6. It comprises a plurality of diodes, each of which provides a different amount of leakage, and in fact, where the leakage is "binary weighted". Four diodes are illustrated in FIG. 6, specifically diodes 78, 80, 82 and 84. (While they are illustrated as rectangular in FIG. 6, they in fact may have the comb-like pattern of FIG. 5). For purposes of discussion, diode 78 is assumed to have an area/periphery of 50/8 units; diode 80 50/4; diode 82, 50/2; and finally, diode 84, 50 units. The entire structure of 56 replaces diode 34 of FIG. 4.

The smallest diode 78 is permanently connected to the load and differential amplifier. On initial testing of the circuit, the amount of additional leakage require is determined and a discretionary connection is then made between diode 78 and one or more of the other diodes. The discretionary connections are shown as connections 86, 88 and 90. If, for instance, diode 84 is required, connection 88 is completed. The other discretionary connections 86 and 90 remain open.

Any one of a plurality of known discretionary connections may be used. These connections are frequently used for redundancy and have been suggested for trimming. Fuses, shielded EPROM devices and other structures are well-known in the art. Note fuses can be opened to make a connection when they are used as part of a simple logic structure.

APPLICATIONS

Figure 2:
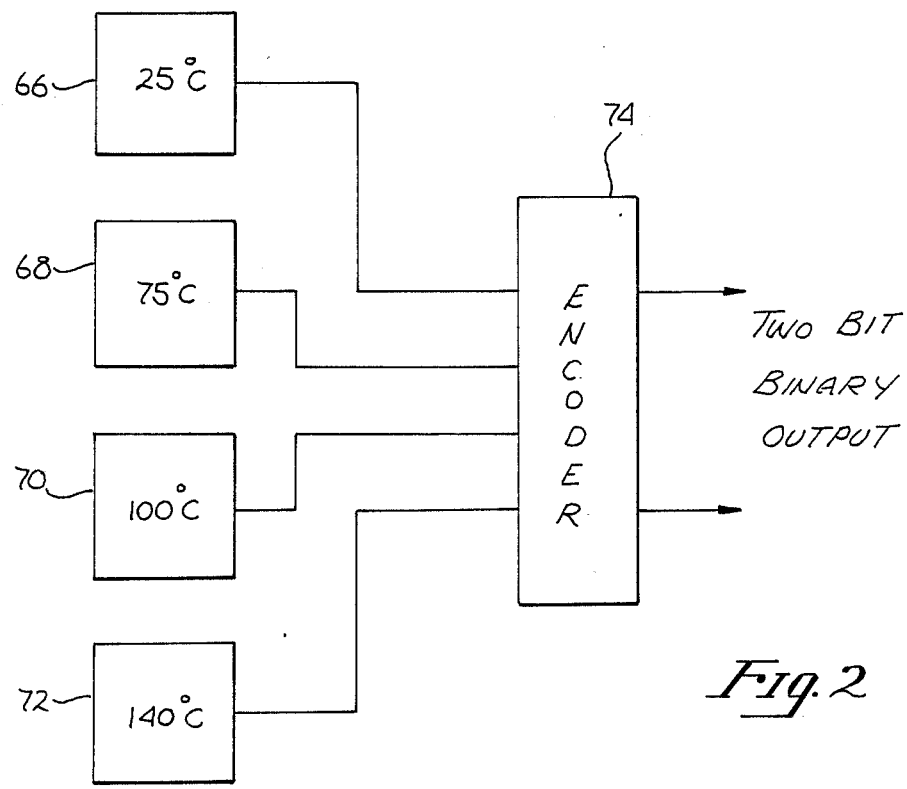
FIG. 2 is a block diagram illustrating a plurality of circuits embodying the present invention included on a single substrate with an encoder each for detecting a different temperature.

The circuit of the present invention detects or sense the temperature of the silicon substrate on which it is fabricated. In most cases, this temperature is substantially a function of the ambient temperature, although in some circuits the temperature can be a function of how hard the circuit is being driven. The circuit of the present invention can be used to adjust conditions on the chip itself as a function of temperature or for providing an indication of ambient temperature for use external to the chip. An example of use of the circuit on chip is shown in FIG. 7, and example of use of the circuit for providing a temperature indication for off-chip use is shown in FIG. 2.

The circuit of the present invention can also be used to sense light. If the substrate is packaged in a package having a window such as an EPROM package, light incident on the diodes has a similar effect as temperature and thus, a predetermined amount of light is analogous to a predetermined temperature for circuit purposes.

Figure 7:
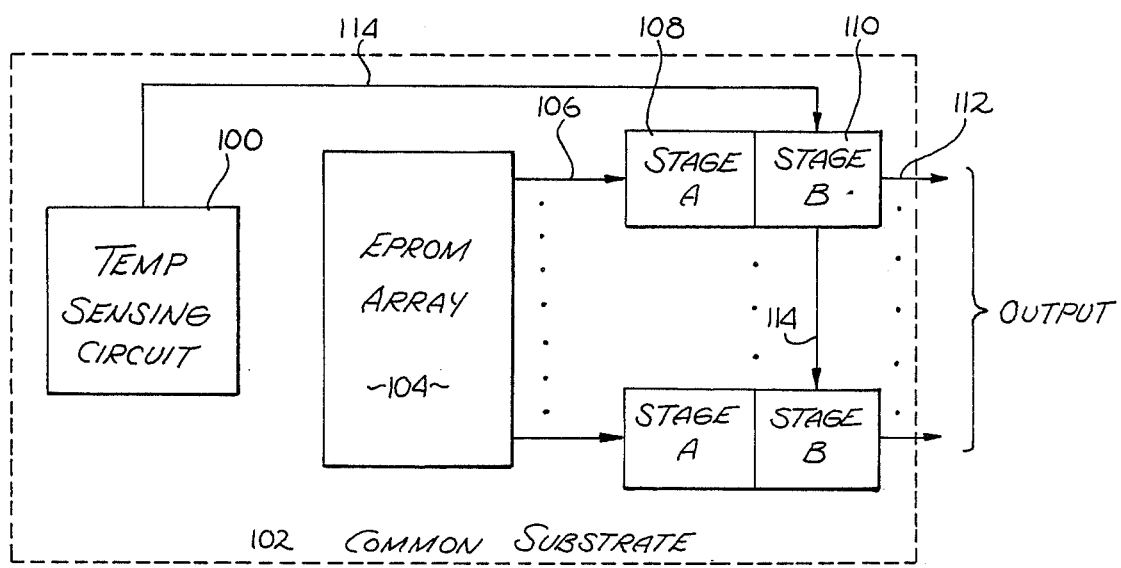
FIG. 7 is a block diagram illustrating the use of a temperature sensing circuit in a memory.

Referring to FIG. 7, a substrate 102 is illustrated which includes a memory array such as an EPROM array 104. A temperature sensing circuit 100 which may include the circuit of FIG. 4 is shown. The circuit 100 provides a binary output on line 114 at a predetermined temperature. The outputs of the array 104 are shown connected to output drivers, for instance, line 106 is connected to an output driver comprising output driver stages 108 and 110. The output drivers provide an output (i.e., data) from the memory such as on line 112.

Typically, the output drivers are designed for worse case ground noise, at low temperature operation. At higher temperatures, the drivers tend to slow down due to mobility reduction in MOS devices. The driver for the output on line 106 is shown having two stages, stage A (108) and stage B (110). At low temperatures, because of the benefit provided by the temperature sensing circuit 100, only stage 110 is used. However, when the circuit 100 detects a higher temperature, both stages 108 and 110 operate. The signal on line 114 enables stage 110, and therefore, the output on line 112 is driven by two stages. Similarly, the signal on line 114 enables the other "B" stages as shown in FIG. 7. It is estimated that using this technique provides an increase in access times of 10-20 nsec. in a typical EPROM.

In FIG. 2, four temperature sensing circuits such as shown in FIG. 4 are illustrated by blocks 66, 68, 70 and 72. These circuits and the encoder 74 are fabricated on the same substrate. Each circuit is designed to provide an output signal at a different temperature. As illustrated, circuit 66 provides an output at 25 degrees C., circuit 68 at 75 degrees C., circuit 70 at 100 degrees C. and circuit 72 at 140 degrees C. The different temperature outputs from the circuit can be obtained by fabricating each of the circuits with a different large diode area and periphery (each circuit can have the same small diode). By way of example, the large diodes can have areas/peripheries (from the lowest temperature sensing circuit to the highest temperature sensing circuit) of 20K microns$^2$/10K microns, 5K microns$^2$/2K microns, 2K microns$^2$/1 microns and 1K microns$^2$/500 microns. The output from the circuits 66, 68, 70 and 72 can be coupled to an encoder 74 to provide a 2-bit binary output.

Thus, a temperature sensing circuit has been described which utilizes MOS device leakage to provide a circuit which is substantially dependent only on temperature.

I claim:

1. An MOS temperature sensing circuit formed on a silicon substrate comprising:
   a first and a second load;
   a first and a second leakage device, coupled to said first and second loads, respectively, said loads biasing said leakage devices such that said devices each have a temperature dependent leakage current;
   one of said first and second leakage devices having a greater substrate area than the other of said devices such that said one device draws more current at a higher temperature than said other device;
   a differential amplifier means for detecting the difference in voltages coupled to said devices;
   whereby a stable temperature sensing circuit is realized.

2. The circuit defined by claim 1 wherein one of said first and second loads provides an offset potential.

3. The circuit defined by claim 2 wherein said first and second leakage devices each comprises a diode.

4. The circuit defined by claim 3 wherein said first and second loads each comprise a field-effect transistor.

5. The circuit defined by claim 1 wherein a plurality of said circuits are fabricated on the same substrate.

6. The circuit defined in claim 5 including trimming means coupled to each of said circuits for adjusting a potential from one of said first and second leakage devices.

7. The circuit defined by claim 6 including trimming means for adjusting a voltage from one of said first and second leakage devices.

8. A MOS temperature sensing circuit formed on a silicon substrate comprising:
   a first and a second field-effect transistor;
   a first and a second diode coupled to said first and second transistors, respectively, such that said first and second diodes are reverse biased, said first diode having a greater substrate area than said second diode;

a differential amplifier coupled to said first and second diodes;

whereby a stable temperature sensing circuit is realized.

9. The circuit defined by claim 8 wherein the periphery of said first diode is larger than the periphery of said second diode.

10. The circuit defined by claim 9 including trimming means for adjusting the potential from one of said first and second diodes.

11. The circuit defined by claim 10 including a plurality of said circuits formed on a single substrate.

12. An MOS temperature sensing circuit formed on a silicon substrate comprising:

a first and a second field-effect transistor;

a first and a second diode coupled to said first and second transistors, respectively, such that said first and second diodes are reverse biased, the periphery of said first diode being greater than the periphery of said second diode;

a differential amplifier coupled to said first and second diodes;

whereby a stable temperature sensing circuit is realized.

13. The circuit defined by claim 12 wherein the area of said first diode is greater than the area of said second diode.

14. In a memory having a storage array and at least one output driver for providing an output data signal from said memory, an improvement comprising:

a temperature sensing circuit for sensing the temperature of said memory comprising:

a first and a second load;

a first and a second leakage device coupled to said first and second loads, respectively, said loads biasing said leakage devices such that said devices each have a temperature dependent leakage current;

one of said first and second leakage devices having a greater substrate area than the other of said devices such that said one device draws more current at a higher temperature than said other device;

a differential amplifier means for detecting the difference in voltages coupled to said loads;

circuit means coupled to said driver and to said temperature sensing circuit such that a portion of said driver is disabled when the temperature of said memory drops to a predetermined temperature;

whereby the access time of said memory is improved.

15. In a memory having a storage array and at least one output driver for providing an output data signal from said memory, an improvement comprising:

a temperature sensing circuit for sensing the temperature of said memory comprising;

an MOS temperature sensing circuit formed on a silicon substrate comprising:

a first and a second field-effect transistor;

a first and a second diode coupled to said first and second transistors, respectively, such that said first and second diodes are reverse biased, said first diode having a greater substrate area than said second diode;

a differential amplifier coupled to said first and second diodes;

circuit means coupled to said driver and to said temperature sensing circuit such that a portion of said driver is disabled when the temperature of said memory drops to a predetermined temperature;

whereby the access time of said memory is improved.

16. The improvement defined by claims 14 or 15 wherein said memory comprises an electrically programmable read-only memory.

* * * * *